(12) United States Patent
Chaji et al.

(10) Patent No.: US 12,188,978 B2
(45) Date of Patent: Jan. 7, 2025

(54) PROBE STRUCTURE FOR MICRO DEVICE INSPECTION

(71) Applicant: VueReal Inc., Waterloo (CA)

(72) Inventors: Gholamreza Chaji, Waterloo (CA); Chang Ho Park, Burlington (CA)

(73) Assignee: VueReal Inc., Waterloo (CA)

( * ) Notice: Subject to any disclaimer, the term of this patent is extended or adjusted under 35 U.S.C. 154(b) by 402 days.

(21) Appl. No.: 17/432,575

(22) PCT Filed: Feb. 20, 2020

(86) PCT No.: PCT/IB2020/051450
§ 371 (c)(1),
(2) Date: Aug. 20, 2021

(87) PCT Pub. No.: WO2020/170201
PCT Pub. Date: Aug. 27, 2020

(65) Prior Publication Data
US 2022/0003815 A1 Jan. 6, 2022

Related U.S. Application Data

(60) Provisional application No. 62/808,593, filed on Feb. 21, 2019.

(51) Int. Cl.
*G01R 1/067* (2006.01)
*G01R 1/073* (2006.01)
*G01R 31/28* (2006.01)

(52) U.S. Cl.
CPC ..... *G01R 31/2891* (2013.01); *G01R 1/06794* (2013.01); *G01R 1/07342* (2013.01)

(58) Field of Classification Search
CPC ............ G01R 31/2891; G01R 1/06794; G01R 1/07342
See application file for complete search history.

(56) References Cited

U.S. PATENT DOCUMENTS

| 5,850,146 A | 12/1998 | Shim et al. |
| 9,778,117 B2 * | 10/2017 | Pagani .................... G01L 1/148 |
| 2004/0113640 A1 * | 6/2004 | Cooper .............. G01R 1/07357 324/750.25 |
| 2007/0103697 A1 | 5/2007 | Degertekin |
| 2007/0126314 A1 | 6/2007 | Ohmori et al. |
| 2012/0074977 A1 * | 3/2012 | Yang .................. G01R 31/2891 324/754.11 |
| 2016/0291761 A1 * | 10/2016 | Huie ...................... G06F 3/045 |

FOREIGN PATENT DOCUMENTS

| CN | 1745308 A | 3/2006 |
| CN | 104508812 A | 4/2015 |

OTHER PUBLICATIONS

TW Office Action relating to TW Application No. 109105635, dated Nov. 7, 2023.
International Searching Authority, PCT Written Opinion of the International Search Authority and International Search Report, dated Jun. 5, 2020.
ROC: TW Office Action relating to TW application No. 109105635, dated Nov. 3, 2023.

* cited by examiner

*Primary Examiner* — Alesa Allgood (57) ABSTRACT

What is disclosed are methods and structures of an improved probe card assembly to inspect micro devices.

16 Claims, 6 Drawing Sheets

PROBE STRUCTURE FOR MICRO DEVICE INSPECTION

FIELD OF THE INVENTION

The present disclosure relates to a wafer inspection apparatus including an improved probe card assembly.

BACKGROUND

In general, a probe card is used to test wafers of semiconductor chips. During the positioning of the probe card over the wafer, a probe card sometimes fails to make a uniform contact with the wafer and becomes tilted. There is a need to provide an improved probe card assembly to enable the uniform contact with the wafer.

SUMMARY

According to one embodiment, there is provided a probe card assembly. The probe card assembly comprising a substrate, one or more probe units that make contact with the substrate, wherein each probe unit comprising: a force sensor or electrode integrated on the substrate, a bridge formed on or over the force sensor and a probe having a probe tip connected to the bridge, wherein the probe is biased to allow measuring at least one attribute of a micro device disposed on a wafer.

According to another embodiment, there is provided a method to test an array of micro devices comprising: an array of probes in a probe card, aligning the array of probes with corresponding micro devices on a substrate, moving the probe card to the micro devices, biasing at least one probe to allow measuring of at least one attribute of the at least one micro device, monitoring a change in at least one attribute of the micro device, and detecting the connection to the micro device through the change in at least one attribute of the micro device.

According to some embodiments, a method to flatten a wafer of micro devices for testing may be provided. The method comprising at least one brace provided for at least one probe unit connected to the wafer, a corresponding area in the wafer aligned to the at least one brace that has no micro device to test; and pushing the corresponding area with the brace.

BRIEF DESCRIPTION OF THE DRAWINGS

The foregoing and other advantages of the disclosure will become apparent upon reading the following detailed description and upon reference to the drawings.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of the invention as defined by the appended claims.

DETAILED DESCRIPTION

Unless defined otherwise, all technical and scientific terms used herein have the same meaning as commonly understood by one of ordinary skill in the art to which this invention belongs.

As used in the specification and claims, the singular forms "a," "an" and "the" include plural references unless the context clearly dictates otherwise.

The term "comprising" as used herein will be understood to mean that the list following is non-exhaustive and may or may not include any other additional suitable items, for example one or more further feature(s), component(s) and/or element(s) as appropriate. The terms "micro device", "microLED" all refer to examples of semiconductor chip.

In general, a probe card is used to test wafers of semiconductor chips. During the positioning of the probe card over the wafer, a probe card may fail to make a uniform contact with the wafer and become tilted. There is a need to provide an improved probe assembly/unit that uniformly senses probe contact with the wafer.

According to one embodiment, an improved probe card assembly is provided.

According to another embodiment, the probe card assembly comprises a substrate and one or more probe units that make contact with the substrate.

In one case, each probe unit comprises a force sensor/electrode integrated on the substrate. In another case, the force sensor or electrode may be a part of the probe tip.

According to some embodiments, a bridge may be formed over the force sensor. The bridge may have one or more conductive layers. The bridge may comprise a first conductive layer to create a capacitance with the force sensor and a second conductive layer that connects the probe tip to a signal. The first conductive layer and the second conductive layer may be the same or different layers.

In one case, a dielectric layer may be provided between the force sensor and the bridge.

In another embodiment, the bridge may have more than one probe tip with more than one electrode to connect them to the signals. The bridge may be a combination of dielectric and conductive layers.

In one case, as the probe tip touches a contact on the micro device or substrate, the bridge is deformed changing the capacitance between the force electrode and the conductive layer on the bridge. This change can be used to calibrate the force applied to the probe. In another case, the deformation in the bridge changes the resistance of the conductive layer on the bridge which can be measured to extract the force applied to the probe.

According to yet other embodiments, as the probe tip touches a micro device on a substrate, the bridge may be deformed such that an electrical characteristic of the probe changes. The electrical characteristic comprises a capacitance change, or a resistance change between the force sensor and the first conductive layer of the bridge.

In one case, the change in electrical characteristics is used to identify a connection between the micro device and the probe tip when a force is applied to the micro device.

According to another embodiment, the contact between the probe tip and the micro device may be checked periodically while pushing the probe card toward the device. The probes may be biased to allow the measuring of at least one attribute of the micro device and monitored to see a change in at least one attribute of the micro device. The change in at least one attribute of the micro device in different areas of the probe card may identify connected and not connected areas.

In another embodiment, a method to test an array of micro devices may comprise these steps: 1) moving the probe card to the micro devices while the probes are biased to allow the measuring of at least one attribute of the micro devices without damaging them 2) monitoring the at least one attribute of the micro devices in different areas related to the probe card as the probe is moving toward the micro devices and 3) if a change happened in the at least one attribute related to the electrical coupling in one or more areas, moving the other areas toward the micro devices and stop moving the coupled areas.

In one case, in response to no connection between the probe tip and the micro device in some areas, the probe may be tilted towards the not connected areas. This is applicable to a single or an array of tips.

In one case, the change in capacitance or resistance may be used to detect defective micro devices on the substrate.

In another case, the change in capacitance/resistance may be used to detect uniformity of the probe card. The signals can be connected in vertically, horizontally or another cluster format.

According to yet another embodiment, connection-test probe tips may be provided on different areas (e.g., on the corners or edges) to detect the contact. If the connection test probes get connected to the wafer in some areas and not other areas, one can tilt the probe card toward the areas that are not connected.

In one case, a brace may be used to push the wafer to be flat. In one case, a different zone may be provided for each probe, wherein each probe may cover a zone or one probe may move in between the zones.

In another case, at least one brace may be provided with the probe unit. The brace may be aligned with the wafer to cover non-active area (i.e., the area that is not going to be tested) and the brace may be brought close to the wafer and push the wafer to make it flat.

Various embodiments in accordance with the present structures and processes provided are described below in detail.

Figure 1:
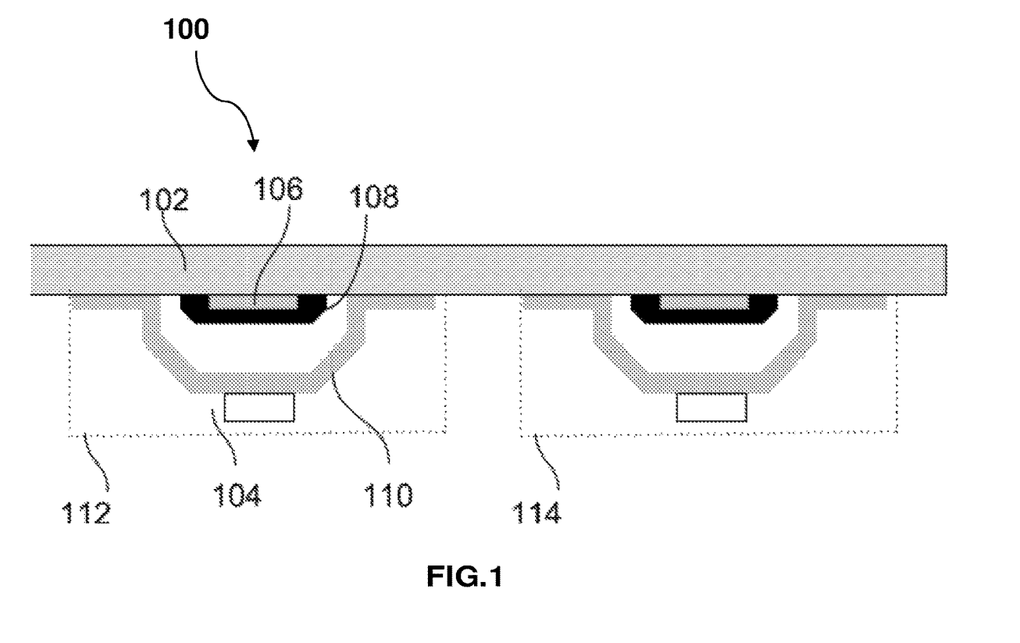
FIG. 1 illustrates a cross-sectional view of a probe card assembly, according to an embodiment of the invention.

With reference to FIG. 1, a probe card assembly 100 is illustrated. The probe card assembly comprises a substrate 102. The substrate may be made of glass, sapphire or other materials. The substrate 102 may have one or more probe units (112, 114) that make contact with the substrate. Each probe unit (112, 114) may comprise a force sensor or electrode 106 integrated on the substrate. A dielectric layer 108 may be provided over the force electrode/sensor 106. A bridge 110 may be formed on or over the force electrode 106. A probe 104 having a probe tip may be connected to the bridge 110. The bridge has one or more conductive layers. In one case, the bridge may comprise a first conductive layer to create a capacitance with the force electrode/sensor 106. In another case, the bridge may comprise a second conductive layer that connects the probe tip to a micro device on a wafer to generate a signal. The first conductive layer and the second conductive layer may be the same or different layers. In one case, the force electrode/sensor 106 may be a part of the probe tip. The bridge 110 may have more than one probe tip with more than one force electrode/sensor to connect them to the signals. In one embodiment, the probe is biased to allow the measuring of electrical characteristics of the micro device disposed on the wafer.

The bridge deforms as the probe tip makes a contact with the micro device and that changes an electrical characteristic of the probe. The electrical characteristic changes may comprise change in capacitance or resistance between the force electrode/sensor and the bridge. The change in electrical characteristics may be used to identify a connection between the micro device and the probe tip when a force is applied to the micro device.

In one embodiment, as the probe tip makes a contact with the micro device or the substrate, the bridge may be deformed because of a change in capacitance between the force electrode and the electrode on the bridge. The change in capacitance may be used to calibrate the force applied to the probe. In another case, the deflection in the bridge changes the resistance of the conductive layer of the bridge.

In another embodiment, a connection between the probe tips and the micro devices may be monitored regularly while pushing the probe toward the devices. One can measure the connection in different areas. If some areas connect and some areas do not, tilt the probe card toward the areas that are not connected.

Also, a connection test probe tip may be provided on areas where the probe is connected to the micro device. The connection test probe tips may be provided on corners of the probe card.

Figure 2:
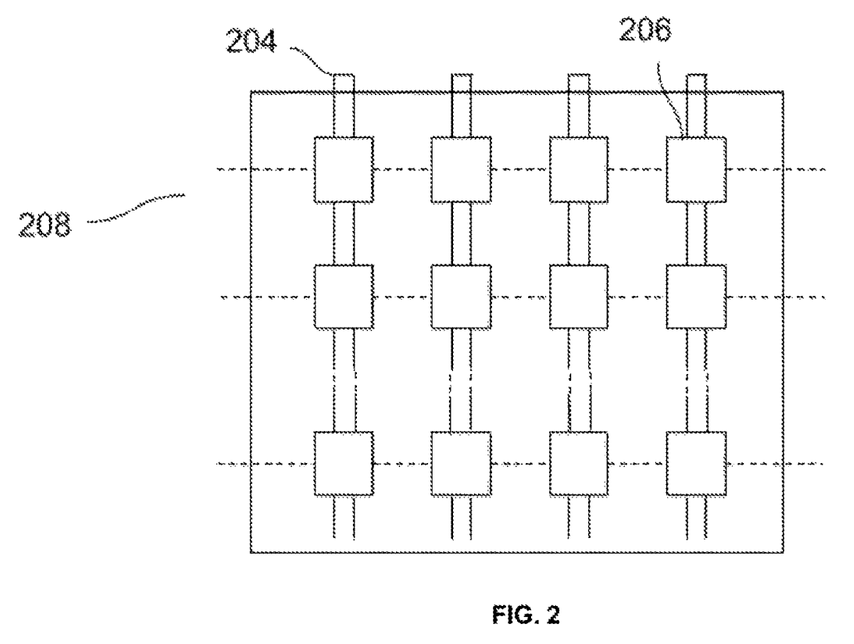
FIG. 2 illustrates an arrangement of the force electrodes with probe units in a grid.

With reference to FIG. 2, an arrangement of the force electrodes with a probe unit in a grid may be provided. A grid 208 shows a plurality of force electrodes 204 provided on a probe unit in column. A plurality of probe electrode 206 may be formed in rows. The probe electrode in at least one row can be activated and the capacitance/resistance may be detected from the force electrode. Therefore, the change in the capacitance/resistance of the force electrode can be associated with that row. The activation can be rotated through different rows. A plurality of probe units 206 may be provided on a substrate. In one case, the force electrodes 204 may be a part of the probe tips of the probes. In one embodiment, a different arrangement of the force electrodes with the probe unit in a grid may be provided. The signals may be connected vertically, horizontally or another cluster format.

Figure 3:
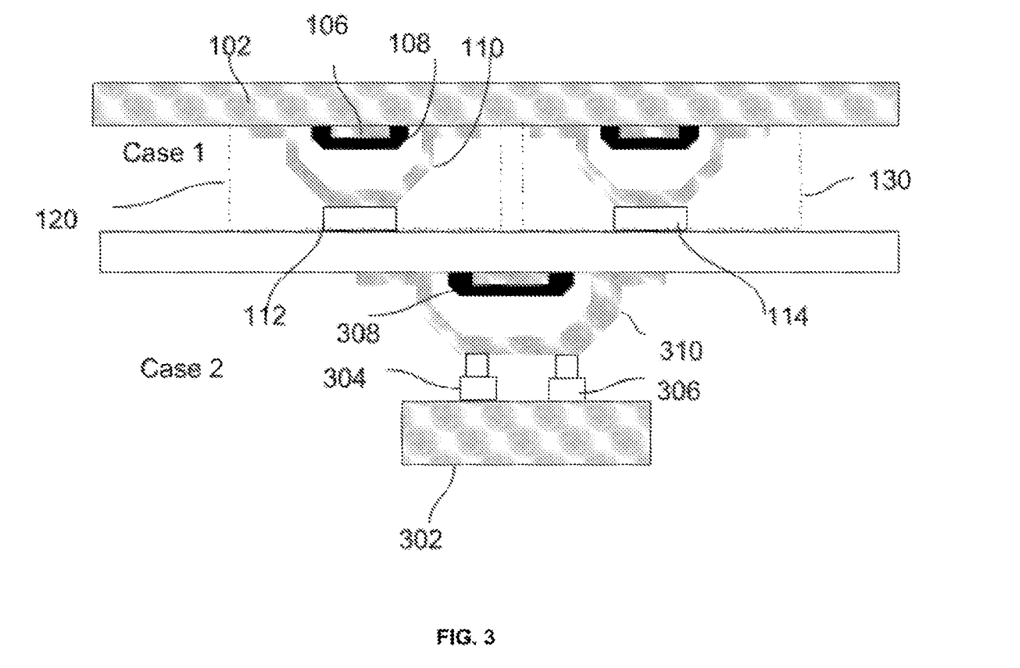
FIG. 3 illustrates a cross-sectional view of a probe card assembly, according to an embodiment of the invention.

With reference to FIG. 3, there may be provided two alternative methods of providing a probe card assembly. In case 1 as discussed in FIG. 1, the probe card assembly comprises a substrate 102. The substrate may be made of glass, sapphire, or other materials. The substrate 102 may have one or more probe units (120, 130) that make contact with the substrate. Each probe unit (120, 130) may comprise a force sensor or electrode 106 integrated on the substrate. A dielectric layer 108 may be provided over the force electrode/sensor 106. A bridge 110 may be formed on or over the force electrode 106. A probe 112 having a probe tip may be connected to the bridge 110. The bridge has one or more conductive layers. In one case, the bridge may comprise a first conductive layer to create a capacitance with the force electrode/sensor 106. In another case, the bridge may comprise a second conductive layer that connects the probe tip to a micro device on a wafer to generate a signal. The first conductive layer and the second conductive layer may be the same or different layers. In one case, force electrode/sensor 106 may be part of the probe tip. The bridge 110 may have more than one probe tip with more than one force electrode/sensor to connect them to the signals.

In another case, case 2, only a single bridge 310 is provided to connect one or more probes (304, 306) on a substrate 302. Here, more than one probe (304, 306) is formed on top of the bridge 310 and the electrode 308 on the bridge can be patterned to provide independent connection to each probe if needed.

Figure 4:
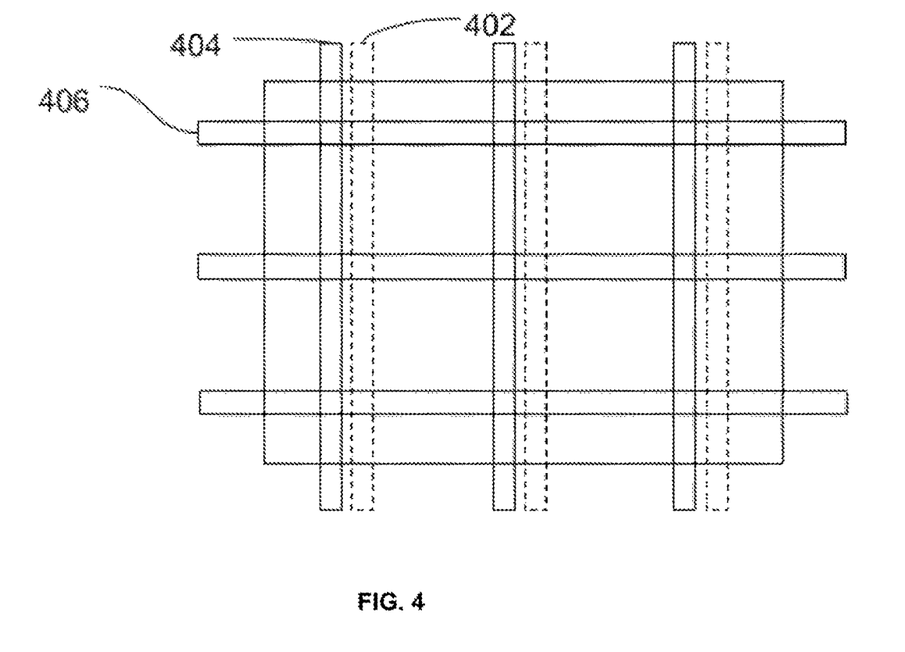
FIG. 4 illustrates an arrangement of the force electrodes and test electrodes in a grid.

With reference to FIG. 4, test electrodes (406, 404, 402) may be provided to connect test probe tips on areas where the probe is connected to the micro device. In one case, connection test probe tips may be provided on different areas (e.g., on the corners or edges) to detect the contact. If the connection test probes connect to the wafer in some areas and not other areas, one can tilt the probe card toward the areas that are not connected.

Figure 5:
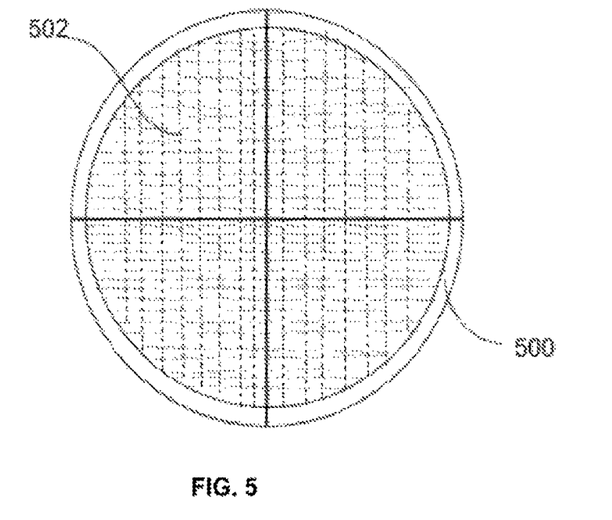
FIG. 5 illustrates different zones of a wafer.

With reference to FIG. 5, a wafer/substrate 500 may be provided with different zones 502. Each zone may be provided with a probe that has a probe tip to test micro devices on the wafer. In one case, the probe can cover one zone, or it may cover all the zones divided on the wafer. The probe may move between the different zones. To test the micro devices on the wafer, there may be provided an array of probes in a probe card. The probes may be aligned to corresponding micro devices on the wafer/substrate. The probe card may be moved to the micro devices. The one or more probes may be biased to allow the measuring of at least one attribute of the at least one micro device. The probes may be monitored regularly to monitor a change in at least one attribute of the micro device and a connection to the micro device may be detected through the change in at least one attribute of the micro device. The change in at least one attribute of the micro device in different areas of the probe card may identify connected areas and not connected areas. In response to no connection between the probe tip and the micro device at some areas, the probe may be tilted toward the not connected areas.

Figure 6:
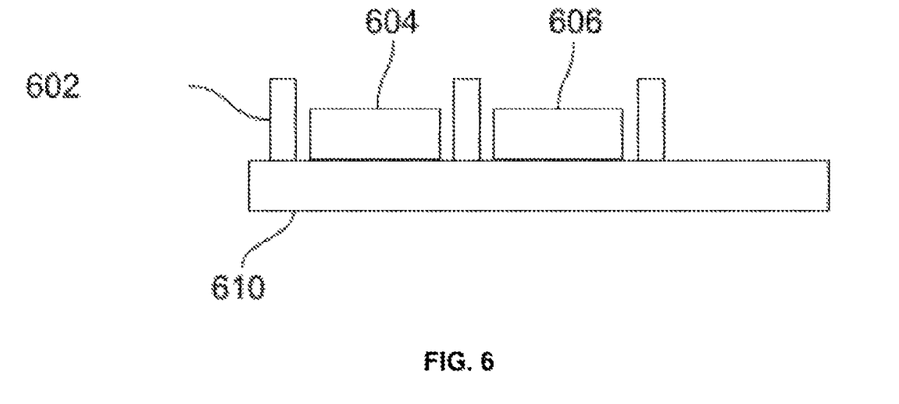
FIG. 6 illustrates the use of braces to push the wafer to become flat.

With reference to FIG. 6, a brace may be provided to flatten the wafer. As the wafer 610 may have a bow or deformation due to stress, probing a relatively large area with a probe card can be challenging, especially in regard to fine probe tips. In one case, at least one brace 602 may be provided with the probe unit (604, 606). There may be more than one brace around the probe units. The probe unit comprises at least one force sensor integrated on the substrate, a dielectric layer over the force electrode/sensor and a bridge may be formed on or over the force electrode. The probe has a probe tip that may be connected to the bridge. The bridge has one or more conductive layers.

In one embodiment, the brace 602 may be aligned with the wafer 610 to cover a non-active area (i.e., the area that is not going to be tested) and the brace may be brought close to the wafer 610 and push the wafer to make it flat. In one case, the probe card can move between the different zones of the wafer created by the brace. In another case, a different probe card can be used for each zone. In response to no connection between the probe tip and the micro device at some areas, the probe may be tilted toward the not connected areas using the brace.

According to one embodiment, a probe card assembly may be provided. The probe card assembly may comprise a substrate, one or more probe units that make contact with the substrate, wherein each probe unit comprises a force sensor or electrode integrated on the substrate, a bridge formed on or over the force sensor and a probe with a probe tip connected to the bridge, wherein the probe is biased to allow the measuring of at least one attribute of a micro device disposed on a wafer.

According to another embodiment, a dielectric layer may be sandwiched between the force sensor and the bridge. The bridge may comprise a first conductive layer to create a capacitance with the force sensor and a second conductive layer that connects the probe tip to a signal. The first conductive layer and the second conductive layer are the same or different layers.

According to some embodiments, the bridge may deform as the probe tip makes a contact with the micro device, and that changes an electrical characteristic of the probe. The electrical characteristic changes comprise a capacitance change or a resistance change between the force sensor and the first conductive layer of the bridge.

According to another embodiment, the change in electrical characteristics is used to identify a connection between the micro device and the probe tip when a force is applied to the micro device. In response to no connection between the probe tip and the micro device at some areas, the probe may be tilted towards the not connected areas. A connection test probe tip may be provided on areas where the probe is connected to the micro device.

According to some embodiments, a method to test an array of micro devices may be provided. The method may comprise providing an array of probes in a probe card, aligning the array of probes with corresponding micro devices on a substrate, moving the probe card to the micro devices, biasing one or more probes to allow the measuring of at least one attribute of the at least one micro device, monitoring a change in at least one attribute of the micro device, and detecting the connection to the micro device through the change in at least one attribute of the micro device. The one or more probes are biased at different areas of the probe card.

According to another embodiment, the change in at least one attribute of the micro device in different areas of the probe card identify connected areas and not connected areas. In response to no connection between the probe tip and the micro device at some areas, the probe can be tilted toward the not connected areas.

According to some embodiments, monitoring the change in at least one attribute of the micro device may comprise monitoring the change in capacitance or resistance. One or more force electrodes may be employed to the one or more probes to detect the connection.

According to one embodiment, a method to flatten a wafer of micro devices for testing is provided, comprising at least one brace provided for at least one probe unit connected to the wafer; a corresponding area in the wafer aligned to the at least one brace that has no micro device to test and pushing the corresponding area with the brace.

According to another embodiment, at least one brace may create different zones and each zone has a probe card that covers the zone to test the micro devices. In another case, a single probe card is moved between the different zones of the wafer created by at least one brace.

In one case, there is a dielectric between the conductive part of the probe and the contact point of the semiconductor chip. Here, the signal is capacitively or inductively coupled between the probe and the semiconductor chip.

While the present disclosure is susceptible to various modifications and alternative forms, specific embodiments or implementations have been shown by way of example in the drawings and are described in detail herein. It should be understood, however, that the disclosure is not intended to be limited to the particular forms disclosed. Rather, the disclosure is to cover all modifications, equivalents, and alternatives falling within the spirit and scope of the invention as defined by the appended claims.

What is claimed is:

1. A probe card assembly comprising:
   a substrate;
   one or more probe units provided on the substrate, wherein each probe unit comprises:
   a force sensor integrated on the substrate;
   a bridge formed over the force sensor; and
   a probe having a probe tip connected to the bridge, wherein the probe is biased to allow measuring of at least one attribute of a micro device disposed on a wafer.

2. The probe card assembly of claim 1, further comprising:
   a dielectric layer sandwiched between the force sensor and the bridge.

3. The probe card assembly of claim 1, further comprising:
   a connection test probe tip on areas where the probe is connected to the micro device.

4. The probe card assembly of claim 1, wherein the force sensor may be a part of the probe tip.

5. The probe card assembly of claim 1, wherein the bridge comprises a first conductive layer to create a capacitance with the force sensor.

6. The probe card assembly of claim 5, wherein the bridge comprises a second conductive layer that connects the probe tip to a signal.

7. The probe card assembly of claim 6, wherein the first conductive layer and the second conductive layer are the same or different layers.

8. The probe card assembly of claim 5, wherein the bridge deforms as the probe tip makes a contact with the micro device that changes an electrical characteristic of the probe.

9. The probe card assembly of claim 8, wherein the change in electrical characteristic comprises a resistance change between the force sensor and the first conductive layer of the bridge.

10. The probe card assembly of claim 8, wherein the deformation in the bridge changes the resistance of the first conductive layer on the bridge which can be measured to extract the force applied to the probe.

11. The probe card assembly of claim 8, wherein the change in electrical characteristics is used to detect uniformity of the probe card.

12. The probe card assembly of claim 8, wherein the contact between the probe tip and the micro device is checked periodically while pushing the probe card toward the device.

13. The probe card assembly of claim 8, wherein the change in electrical characteristic comprises a capacitance change between the force sensor and the first conductive layer of the bridge.

14. The probe card assembly of claim 13, wherein the change in capacitance is used to calibrate a force applied to the probe.

15. The probe card assembly of claim 8, where the change in electrical characteristics is used to identify a connection between the micro device and the probe tip when a force is applied to the micro device.

16. The probe card assembly of claim 15, wherein in response to no connection between the probe tip and the micro device at areas, the probe tilts towards the not connected areas.

* * * * *